United States Patent
Huott et al.

(10) Patent No.: US 10,949,295 B2
(45) Date of Patent: Mar. 16, 2021

(54) IMPLEMENTING DYNAMIC SEU DETECTION AND CORRECTION METHOD AND CIRCUIT

(71) Applicant: International Business Machines Corporation, Armonk, NY (US)

(72) Inventors: William V. Huott, Holmes, NY (US); Adam J. McPadden, Underhill, VT (US); Anuwat Saetow, Austin, TX (US); David D. Cadigan, Fairfield, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/219,166

(22) Filed: Dec. 13, 2018

(65) Prior Publication Data

US 2020/0192751 A1    Jun. 18, 2020

(51) Int. Cl.
*G11C 29/00* (2006.01)
*G06F 11/10* (2006.01)
*H03K 3/037* (2006.01)

(52) U.S. Cl.
CPC ........ *G06F 11/106* (2013.01); *G06F 11/1032* (2013.01); *G06F 11/1076* (2013.01); *H03K 3/037* (2013.01)

(58) Field of Classification Search
CPC ............... G06F 11/106; G06F 11/1032; G06F 11/1076; H03K 3/037
See application file for complete search history.

(56) References Cited

U.S. PATENT DOCUMENTS

| 6,975,238 | B2 | 12/2005 | Schneider |
| 7,240,277 | B2 | 7/2007 | Anderson et al. |
| 7,620,883 | B1 | 10/2009 | Carmichael et al. |
| 8,589,759 | B2 | 11/2013 | Cox et al. |
| 8,612,814 | B1 | 12/2013 | Tan et al. |
| 9,164,842 | B2 | 10/2015 | Flautner et al. |

(Continued)

FOREIGN PATENT DOCUMENTS

GB        2431491 A     4/2007

OTHER PUBLICATIONS

She et al., "SEU Tolerant Memory Using Error Correction Code", IEEE, 2012 (p. 207, col. 2, paras 1-3). http://ieeexplore.ieee.org/abstract/document/6123177/.

*Primary Examiner* — Guerrier Merant
(74) *Attorney, Agent, or Firm* — Donald J. O'Brien

(57) ABSTRACT

A method and a circuit for implementing dynamic single event upset (SEU) detection and correction, and a design structure on which the subject circuit resides are provided. The circuit implements detection, correction and scrubbing of unwanted state changes due to SEUs, noise or other event in semiconductor circuits. The circuit includes a plurality of L1 L2 latches connected in a chain, each L1 L2 latch includes an L1 latch and an L2 latch with the L2 latch having a connected output monitored for a flip. A single L2 detect circuit exclusive OR (XOR) is connected to each L2 latch. An L2 detect circuit XOR tree includes an input connected to a true output of a respective L2 latch in the chain. An L2 clock (LCK) trigger circuit is connected to an output of the L2 detect circuit XOR tree and is shared across each of the plurality of L1 L2 latches for correcting bit flip errors.

20 Claims, 5 Drawing Sheets

(56) References Cited

U.S. PATENT DOCUMENTS

| | | | |
|---|---|---|---|
| 2006/0005091 A1* | 1/2006 | Mitra | G01R 31/31816 |
| | | | 714/726 |
| 2006/0069941 A1 | 3/2006 | Trantham et al. | |
| 2006/0184852 A1* | 8/2006 | Chu | G06F 11/24 |
| | | | 714/746 |
| 2006/0200719 A1* | 9/2006 | Keller | G01R 31/318547 |
| | | | 714/732 |
| 2016/0314038 A1 | 10/2016 | Russell | |

* cited by examiner

IMPLEMENTING DYNAMIC SEU DETECTION AND CORRECTION METHOD AND CIRCUIT

FIELD OF THE INVENTION

The present invention relates generally to the data processing field, and more particularly, relates to a method and a circuit for implementing dynamic single event upset (SEU) detection and correction, and a design structure on which the subject circuit resides.

DESCRIPTION OF THE RELATED ART

Cosmic ray induced terrestrial neutrons can flip values stored in static random-access memory (SRAM) cells, flip-flops and latches commonly used in semiconductor chips. Cosmic ray induced terrestrial neutrons can cause single event upsets (SEUs) in logic circuitry, also known as glitches.

These energetic particles can cause chip failure, modify stored data, change in functional logic operation, and the like. This is a serious concern for the semiconductor industry and applications which require high reliability, such as military, banking, government agencies, medical, and others.

Extensive engineering at substantial expense is applied to minimize susceptibility to energetic particle driven upsets. Dedicated circuits to manage single event upset (SEU), also referred to as soft errors (SERs), affect chip area, cost, and reliability for customers.

SUMMARY OF THE INVENTION

Principal aspects of the present invention are to provide a method and a circuit for implementing dynamic single event upset (SEU) detection and correction, and a design structure on which the subject circuit resides. Other important aspects of the present invention are to provide such method and circuit substantially without negative effects and that overcome some disadvantages of prior art arrangements.

In brief, a method and a circuit for implementing dynamic single event upset (SEU) detection and correction, and a design structure on which the subject circuit resides are provided. The circuit implements detection, correction and scrubbing of unwanted state changes due to SEUs, noise or other event in semiconductor circuits. The circuit includes a plurality of L1 L2 latches connected in a chain, each L1 L2 latch includes an L1 latch and an L2 latch with the L2 latch having a connected output monitored for a flip. A single L2 detect circuit exclusive OR (XOR) is connected to each L2 latch. An L2 detect circuit XOR tree includes an input connected to a true output of a respective L2 latch in the chain. An L2 clock (LCK) trigger circuit is connected to an output of the L2 detect circuit XOR tree and is shared across each of the plurality of L1 L2 latches for correcting bit flip errors.

In accordance with features of the invention, the SEU problem is reduced by dynamically detecting, and correcting unwanted latch flips while using a scrubbing technique to help minimize circuit overhead.

In accordance with features of the invention, an L2 bit flip is detected by the L2 detect circuit XOR tree. The LCK trigger circuit causes all L2 CLKs to fire and reload the L1 data correcting the bit flip error.

In accordance with features of the invention, the L2 clock (L2 CLK) trigger circuit includes an initial parity latch.

In accordance with features of the invention, L1 Data can flip via SEU, with a periodically scrub provided to scrub the L1 latch using an L1_SCRUB_CLK reloading the latch L1, correcting the bit flip. The scrubbing rate or how often L1_SCRUB_CLK fires is adjusted to minimize risk window in time.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized, and structural changes may be made without departing from the scope of the invention.

The terminology used herein is for the purpose of describing embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and a circuit for implementing single event upset (SEU) parity detection, correction, and scrubbing in semiconductor circuits, and a design structure on which the subject circuit resides are provided. The circuit includes a single XOR parity detection circuit connected to an L2 trigger circuit. This will automatically correct flipped latches.

Figure 1A:
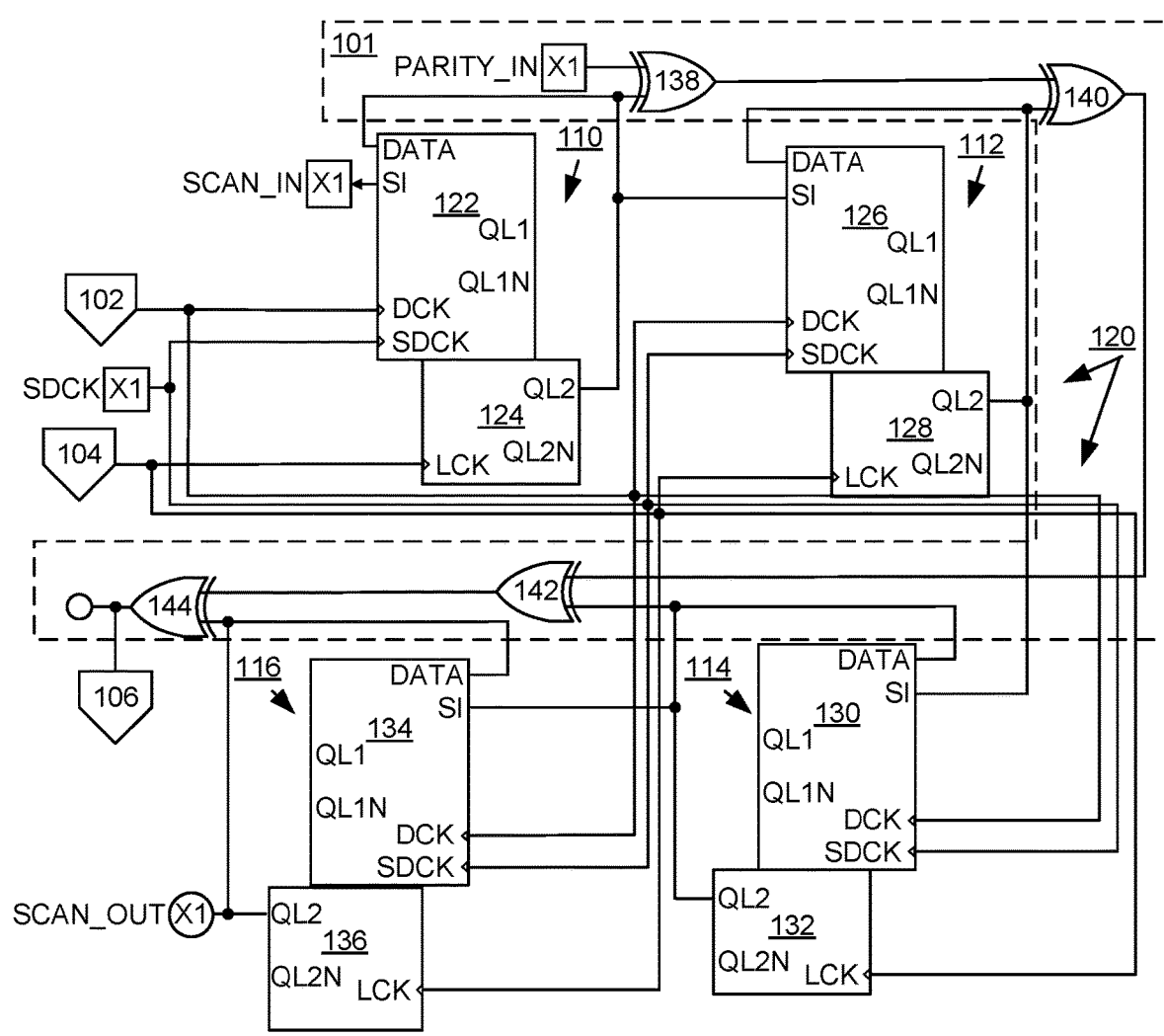
FIGS. 1A and 1B together provides a schematic and block diagram representation of an example single event upset (SEU) parity detection and correction circuit in accordance with preferred embodiments.
Figure 1B:
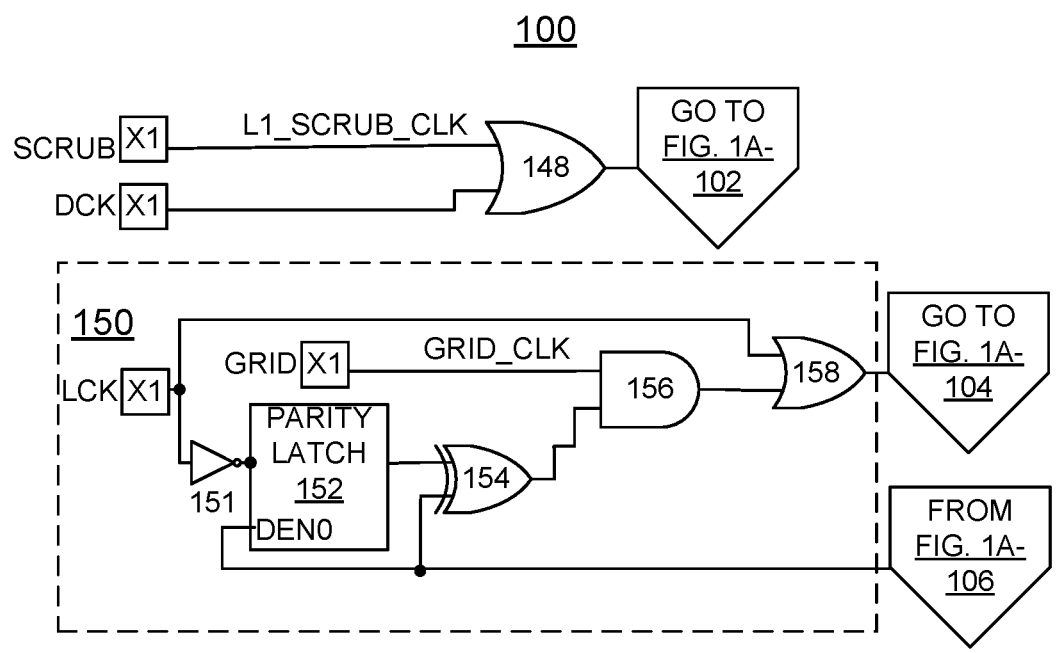

Having reference now to the drawings, in FIGS. 1A and 1B, there is shown an example single event upset (SEU) parity detection and correction circuit generally designated by the reference character 100 in accordance with preferred embodiments. Circuit 100 includes an L2 detect circuit exclusive OR (XOR) tree 101 shown in FIG. 1A, and an L2 clock (LCK) trigger circuit 150 shown in FIG. 1B that is connected to an output of the L2 detect circuit XOR tree 101 and is shared across each of the plurality of L1 L2 latches 110, 112, 114, and 116 in a chain 120 in FIG. 1A.

In accordance with features of the invention, circuit 100 is designed for detecting and automatically correcting flipped latches. Periodic scrubbing of L1 DCK input from L1_SCRUB_CLK reloads L1 latches, correcting any SEU. The scrubbing rate is adjusted to minimize risk window in time.

Circuit 100 implements detection and correction of unwanted state changes due to SEUs, noise or other event in a chain 120 of L1 L2 latches 110, 112, 114, and 116. Each latch of L1 L2 latches 110, 112, 114, and 116 includes an L1 latch and an L2 latch with the L2 latch having the connected output to a respective XOR of the L2 detect circuit XOR tree 101. Latch 110 includes L1 latch 122 and L2 latch 124 with the true output of the L2 latch 124 connected to an XOR 138. Latch 112 includes L1 latch 126 and L2 latch 128 with the true output of the L2 latch 128 connected to an XOR 140. Latch 114 includes L1 latch 130 and L2 latch 132 with the true output of the L2 latch 132 connected to an XOR 142. Latch 116 includes L1 latch 134 and L2 latch 136 with the true output of the L2 latch 136 connected to an XOR 144 providing output SCAN_OUT.

The L2 detect circuit exclusive OR (XOR) tree 101 includes a first XOR 138 receiving a parity input PARITY_IN. The L1 data of L1 latch 122 connected with the true output of the L2 latch 124 of the first L1 L2 latch 110 is applied to the XOR 138. The output of XOR 138 is applied to a first input of XOR 140 and L1 data of L1 latch 126 connected with the true output of the L2 latch 128 is applied to a second input of XOR 140. The output of XOR 140 is applied to a first input of XOR 142 and L1 data of L1 latch 130 connected with the true output of the L2 latch 132 is applied to a second input of XOR 142. The output of XOR 142 is applied to a first input of XOR 144 and L1 data of L1 latch 134 connected with the true output of the L2 latch 136 is applied to a second input of XOR 144. The output of XOR 144 indicated at 106 is applied to the L2 clock (LCK) trigger circuit 150 shown in FIG. 1B.

L1 clocks DCK indicated at line 102 and Scan clock SCLK are applied to each L1 latch 122, 126, 130, and 134, and shared across each of the plurality of L1 L2 latches 110, 112, 114, and 116.

Referring also to FIG. 1B, SEU parity detection and correction circuit 100 includes an OR gate 148 receiving inputs of a L1_SCRUB_CLK and an DCK and providing an output of the L1 clock DCK at line 102. The L1_SCRUB_CLK input provides periodic scrubbing of L1 DCK input, reloading the L1 latch, correcting an SEU error.

L2 clock (LCK) trigger circuit 150 is connected to an output of the L2 detect circuit XOR tree 101 as indicated at line 106 and provides an LCK output shared across each of the plurality of L1 L2 latches 110, 112, 114, and 116 as indicated at line 104 in FIG. 1A.

L2 clock (LCK) trigger circuit 150 receives an LCK input inverted by inverter 151 and applied to an initial parity latch 152. The output of the L2 detect circuit XOR tree 101 at line 106 is applied to the initial parity latch 152 and an XOR 154, receiving a true output of the initial parity latch 152. The output of XOR 154 is combined with a GRID_CLK by an AND gate 156. The output of AND gate 156 and the LCK input are applied to an OR gate 158. The output of OR gate 158 provides the L2 clock (LCK) output of LCK trigger circuit 150 that is applied to clock each of the L2 latches 124, 128, 132, and 136 in the chain 120.

Figure 2A:
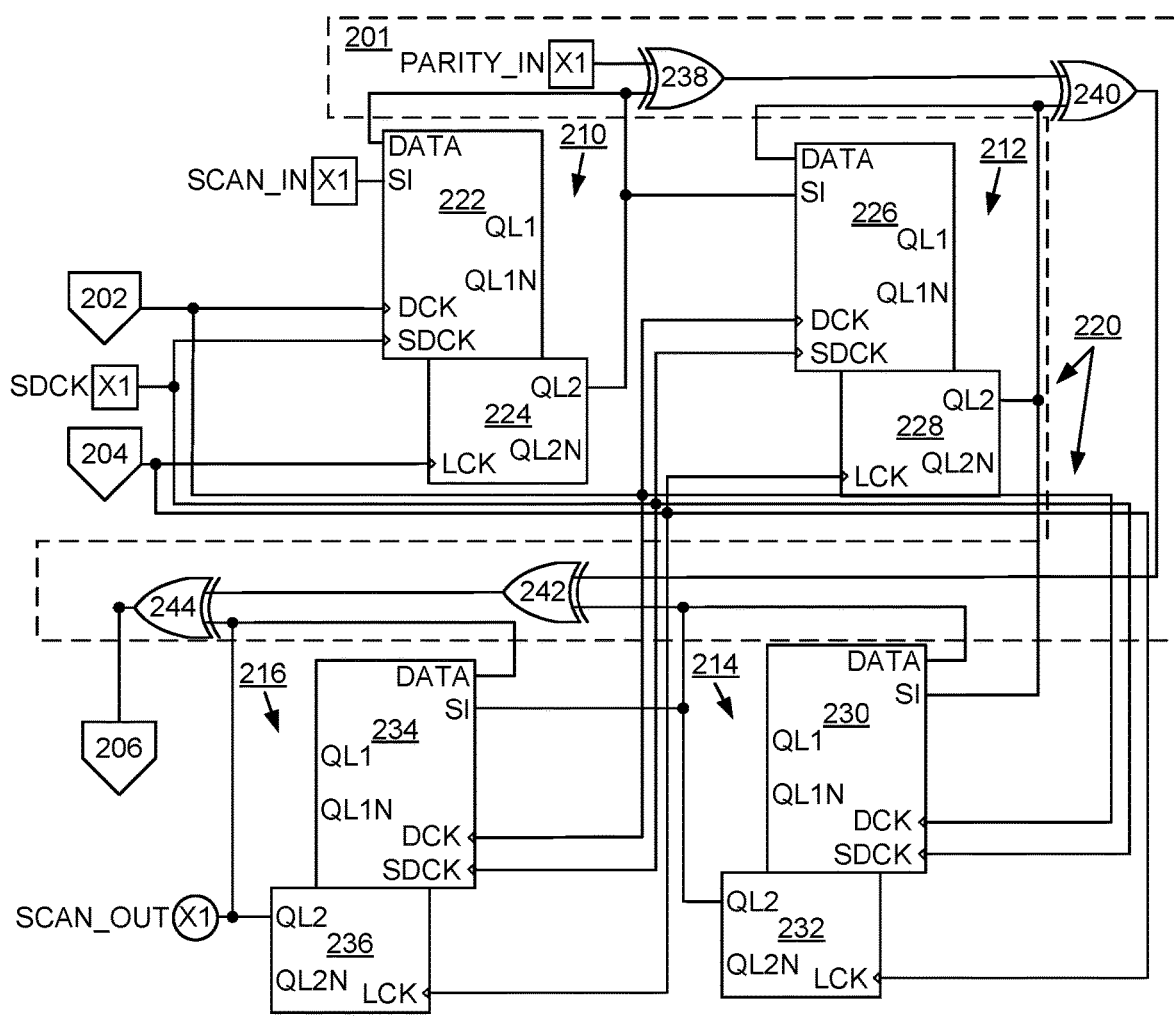
FIGS. 2A and 2B together provides a schematic and block diagram representation of another example single event upset (SEU) parity detection and correction circuit in accordance with preferred embodiments.
Figure 2B:
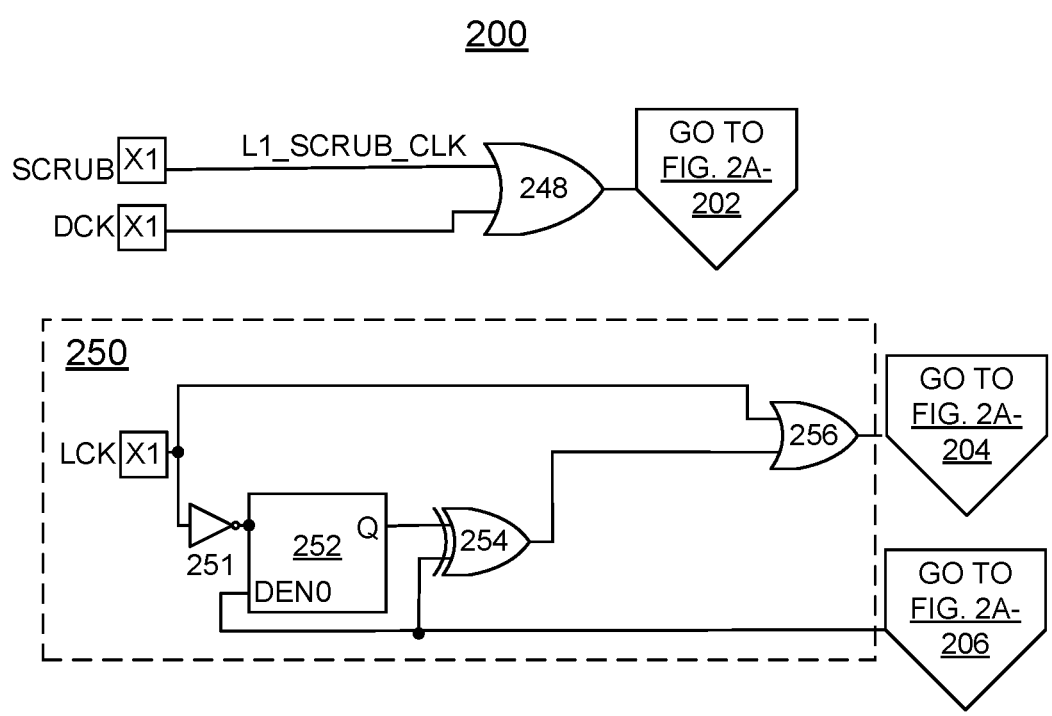

Referring to FIGS. 2A and 2B, there is shown a schematic and block diagram representation of another example single event upset (SEU) parity detection and correction circuit generally designated by the reference character 200 in accordance with preferred embodiments. Circuit 200 includes an L2 detect circuit exclusive OR (XOR) tree 201 shown in FIG. 2A, and an L2 clock (LCK) trigger circuit 250 shown in FIG. 2B that is connected to an output of the L2 detect circuit XOR tree 201 and is shared across each of the plurality of L1 L2 latches 210, 212, 214, and 216 in a chain 220 in FIG. 2A.

In accordance with features of the invention, circuit 200 is designed for detecting and automatically correcting flipped latches. Periodic scrubbing of L1 DCK input from L1_SCRUB_CLK reloads L1 latches, correcting any SEU. The scrubbing rate is adjusted to minimize risk window in time.

Circuit 200 implements detection and correction of unwanted state changes due to SEUs, noise or other event in a chain 220 of L1 L2 latches 210, 212, 214, and 216. Each latch of L1 L2 latches 210, 212, 214, and 216 includes an L1 latch and an L2 latch with the L2 latch having the connected output to a respective XOR of the L2 detect circuit XOR tree 201. Latch 210 includes L1 latch 222 and L2 latch 224 with the true output of the L2 latch 224 connected to an XOR 238. Latch 212 includes L1 latch 226 and L2 latch 228 with the true output of the L2 latch 228 connected to an XOR 240. Latch 214 includes L1 latch 230 and L2 latch 232 with the true output of the L2 latch 232 connected to an XOR 242. Latch 216 includes L1 latch 234 and L2 latch 236 with the true output of the L2 latch 236 connected to an XOR 244 providing output SCAN_OUT.

The L2 detect circuit exclusive OR (XOR) tree 201 includes a first XOR 238 receiving a parity input PARITY_IN. The L1 data of L1 latch 222 connected with the true output of the L2 latch 224 of the first L1 L2 latch 210 is applied to the XOR 238. The output of XOR 238 is applied to a first input of XOR 240 and L1 data of L1 latch 226 connected with the true output of the L2 latch 228 is applied to a second input of XOR 240. The output of XOR 240 is applied to a first input of XOR 242 and L1 data of L1 latch 230 connected with the true output of the L2 latch 232 is applied to a second input of XOR 242. The output of XOR 242 is applied to a first input of XOR 244 and L1 data of L1 latch 234 connected with the true output of the L2 latch 236 is applied to a second input of XOR 244. The output of XOR 244 indicated at 206 is applied to the L2 clock (LCK) trigger circuit 250 shown in FIG. 2B.

L1 clocks DCK indicated at line 202 and Scan clock SCLK are applied to each L1 latch 222, 226, 230, and 234, and shared across each of the plurality of L1 L2 latches 210, 212, 214, and 216.

Referring also to FIG. 2B, SEU parity detection and correction circuit 200 includes an OR gate 248 receiving inputs of a L1_SCRUB_CLK and an DCK and providing an output of the L1 clock DCK at line 202. The L1_SCRUB_CLK input provides periodic scrubbing of L1 DCK input, reloading the L1 latch, correcting an SEU error.

L2 clock (LCK) trigger circuit 250 is connected to an output of the L2 detect circuit XOR tree 201 as indicated at line 206 and provides an LCK output shared across each of the plurality of L1 L2 latches 210, 212, 214, and 216 as indicated at line 204 in FIG. 2A.

L2 clock (LCK) trigger circuit 250 receives an LCK input inverted by inverter 251 and applied to an initial parity latch 252. The output of the L2 detect circuit XOR tree 201 at line 206 is applied to the initial parity latch 252 and to an XOR 254, receiving a true output of the initial parity latch 252. In the L2 clock (LCK) trigger circuit 250, the grid clock GRID_CLK and AND gate 156 of L2 clock (LCK) trigger circuit 150 of FIG. 1B are removed. The output of XOR 254 and the LCK input are applied to an OR gate 256. The output of OR gate 256 provides the L2 clock (LCK) output of LCK trigger circuit 250 that is applied to clock each of the L2 latches 224, 228, 232, and 236 in the chain 220. If an L2 latch flips due to SEU, parity detect will fire the L2 reload automatically, reducing the time L2 latch is in an incorrect state. Improved reliability of a functional circuit, which depends on L2 latch being in the correct state. Circuit 200 saves area, with less field effect transistors needed and reduces SEU risk exposure at the same time.

In accordance with features of the invention, circuits 100, 200 provide enhanced unwanted state change detection and correction due to SEUs minimizing overall silicon space and complexity impact. A single XOR per L2 latch enables SEU detection. Each L2 LCK trigger circuit 150, 250 advantageously is shared across multiple latches. In circuit 200, the L2 LCK trigger circuit 250 connected directly to the L2 parity detect, enables L2 data to be reloaded from L1 latch without requiring another clock input with the grid clock eliminated.

Figure 3:
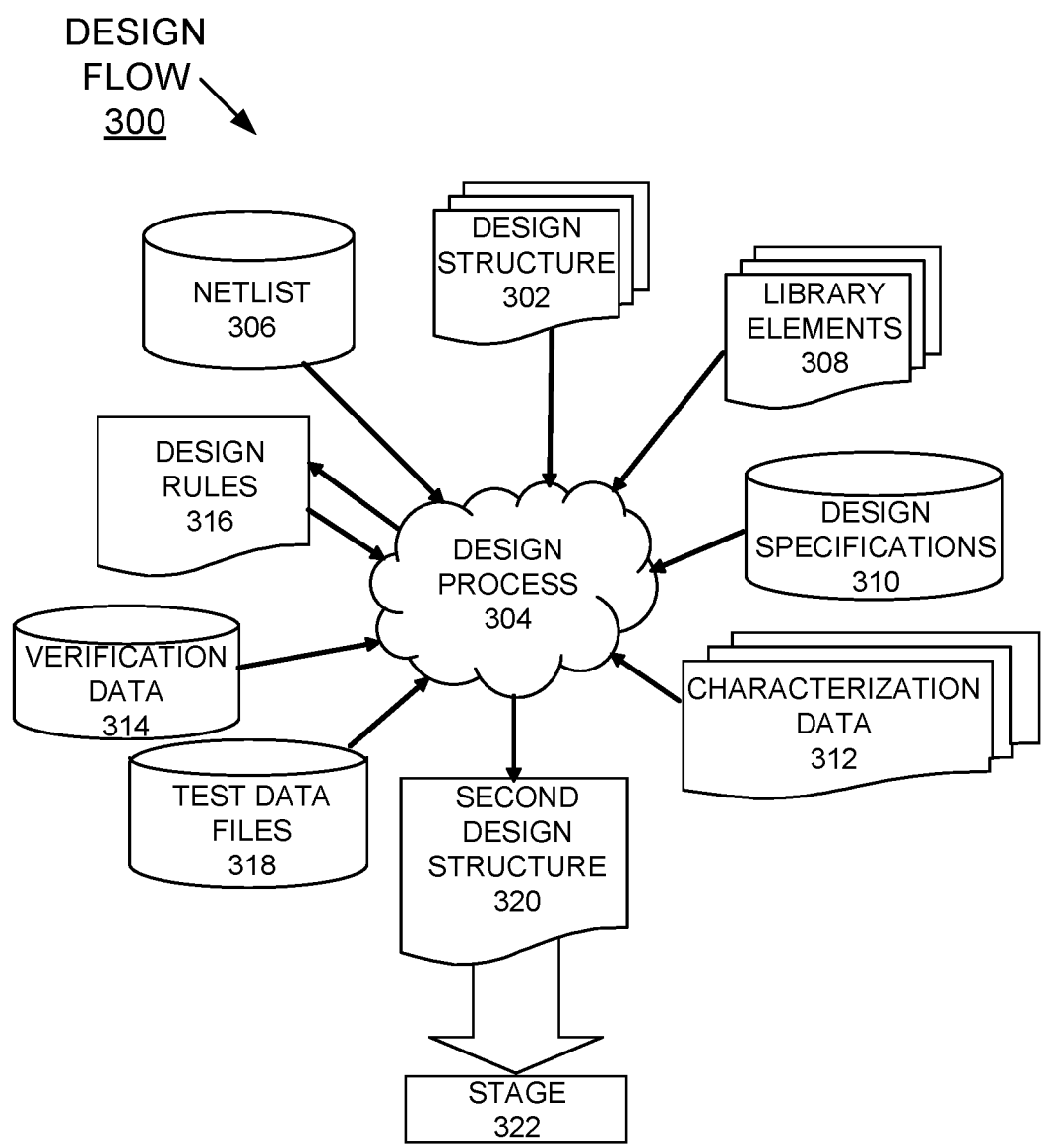
FIG. 3 is a flow diagram of a design process used in semiconductor design, manufacturing, and/or test.

FIG. 3 shows a block diagram of an example design flow 300. Design flow 300 may vary depending on the type of IC being designed. For example, a design flow 300 for building an application specific IC (ASIC) may differ from a design flow 300 for designing a standard component. Design structure 303 is preferably an input to a design process 304 and may come from an IP provider, a core developer, or other design company or may be generated by the operator of the design flow, or from other sources. Design structure 303 comprises circuits 100, 200 in the form of schematics or HDL, a hardware-description language, for example, Verilog, VHDL, C, and the like. Design structure 303 may be contained on one or more machine readable medium. For example, design structure 302 may be a text file or a graphical representation of circuits 100, 200. Design process 304 preferably synthesizes, or translates circuits 100, 200 into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuits.

Design process 304 may include using a variety of inputs; for example, inputs from library elements 302 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 310, characterization data 312, verification data 314, design rules 316, and test data files 318, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Design process 304 preferably translates an embodiment of the invention as shown in FIGS. 1A, 1B, and 2A, 2B along with any additional integrated circuit design or data (if applicable), into a second design structure 320. Design structure 320 resides on a storage medium in a data format used for the exchange of layout data of integrated circuits, for example, information stored in a GDSII (GDS3), GL1, OASIS, or any other suitable format for storing such design structures. Design structure 320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, and 2A, 2B. Design structure 320 may then proceed to a stage 322 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing single event upset (SEU) parity detection and correction comprising:
    said SEU parity detection and correction circuit detecting and automatically correcting unwanted state changes due to SEUs in a latch;
    said SEU parity detection and correction circuit including a plurality of L1 L2 latches connected in a chain, each L1 L2 latch includes an L1 latch and an L2 latch with each L2 latch having a connected output monitored for a flip;
    an L2 detect circuit XOR tree includes a plurality of XOR inputs, each of the plurality of XOR inputs connected to a true output of each respective L2 latch in the chain; and
    an L2 clock (LCK) trigger circuit connected to an output of the L2 detect circuit XOR tree and shared across each of the plurality of L1 L2 latches for correcting bit flip errors.

2. The circuit as recited in claim 1, includes responsive to an L2 bit flip detected by the L2 detect circuit XOR tree, said LCK trigger circuit causes all L2 CLKs to fire and reload the L1 data correcting the bit flip error.

3. The circuit as recited in claim 1, wherein said L2 clock (LCK) trigger circuit includes an initial parity latch.

4. The circuit as recited in claim 3, wherein said L2 clock (LCK) trigger circuit includes an exclusive OR (XOR) gate having an input connected to an output of said initial parity latch and an input connected to the output of said L2 detect circuit XOR tree.

5. The circuit as recited in claim 4, further includes an OR gate having an input coupled to an output of said XOR and an input coupled to an LCK input, said OR gate providing an output LCK.

6. The circuit as recited in claim 1, includes said output LCK applied to each said L2 latch.

7. The circuit as recited in claim 1, includes L1 clocks DCK and Scan clock SCLK applied to each L1 latch, and shared across each of the plurality of L1 L2 latches.

8. The circuit as recited in claim 1, includes an OR gate receiving inputs of a L1_SCRUB_CLK and an DCK, and providing an output of said L1 clock DCK.

9. The circuit as recited in claim 8, includes said L1_SCRUB_CLK input provides periodic scrubbing of L1 DCK input, reloading the L1 latch, correcting an SEU error.

10. The circuit as recited in claim 8, includes a periodic scrubbing rate is adjusted by adjusting a firing rate of said L1_SCRUB_CLK input.

11. A design structure embodied in a machine readable medium used in a design process, the design structure comprising:

a circuit tangibly embodied in the machine readable medium used in the design process, said circuit for implementing SEU parity detection and correction, said SEU parity detection and correction detecting and correcting unwanted state changes due to SEUs in a latch, said SEU parity detection and correction circuit comprising:

a plurality of L1 L2 latches connected in a chain, each L1 L2 latch includes an L1 latch and an L2 latch with each L2 latch having a connected output monitored for a flip;

an L2 detect circuit XOR tree includes a plurality of XOR inputs, each of the plurality of XOR inputs connected to a true output of each respective L2 latch in the chain; and an L2 clock (LCK) trigger circuit connected to an output of the L2 detect circuit XOR tree and shared across each of the plurality of L1 L2 latches for correcting bit flip errors; wherein the design structure, when read and used in the manufacture of a semiconductor chip produces a chip comprising said SEU parity detection and correction circuit.

12. The design structure of claim 11, wherein the design structure comprises a netlist, which describes said SEU parity detection and correction circuit.

13. The design structure of claim 11, wherein the design structure resides on storage medium as a data format used for the exchange of layout data of integrated circuits.

14. The design structure of claim 11, wherein the design structure includes at least one of test data files, characterization data, verification data, or design specifications.

15. The design structure of claim 11, wherein said L2 clock (LCK) trigger circuit includes an exclusive OR (XOR) gate having an input connected to an output of said initial parity latch and an input connected to the output of said L2 detect circuit XOR tree, and an OR gate having an input coupled to an output of said XOR and an input coupled to an LCK input, said OR gate providing an output LCK.

16. The design structure of claim 11, wherein said SEU parity detection and correction circuit includes L1 clocks DCK and Scan clock SCLK applied to each L1 latch and shared across each of the plurality of L1 L2 latches.

17. The design structure of claim 16, wherein said SEU parity detection and correction circuit includes an OR gate receiving inputs of a L1_SCRUB_CLK and an DCK, and providing an output of said L1 clock DCK, said L1_SCRUB_CLK input provides periodic scrubbing of L1 DCK input, reloading the L1 latch, correcting an SEU error.

18. A method for implementing single event upset (SEU) parity detection and correction comprising:

providing a SEU parity detection and correction circuit for detecting and correcting unwanted state changes due to SEUs in a latch;

providing a plurality of L1 L2 latches connected in a chain, each L1 L2 latch includes an L1 latch and an L2 latch with each L2 latch having a connected output monitored for a flip;

providing an L2 detect circuit XOR tree that includes a plurality of XOR inputs, each of the plurality of XOR inputs connected to a true output of each respective L2 latch in the chain; and providing an L2 clock (LCK) trigger circuit connected to an output of the L2 detect circuit XOR tree and shared across each of the plurality of L1 L2 latches for correcting bit flip errors.

19. The method of claim 18, includes responsive to an L2 bit flip detected by the L2 detect circuit XOR tree, said LCK trigger circuit causes all L2 CLKs to fire and reload the L1 data correcting the bit flip error.

20. The method of claim 18, includes using an L1_SCRUB_CLK reloading the latch L1 for correcting bit flip errors via SEU in the L1 latches.

* * * * *